US009851643B2

(12) United States Patent
Chilese et al.

(10) Patent No.: US 9,851,643 B2
(45) Date of Patent: Dec. 26, 2017

(54) APPARATUS AND METHODS FOR RETICLE HANDLING IN AN EUV RETICLE INSPECTION TOOL

(71) Applicant: KLA-Tencor Corporation, Milpitas, CA (US)

(72) Inventors: Francis Charles Chilese, San Ramon, CA (US); Ulrich Pohlmann, Jena (DE); Detlef Wolter, Jena (DE); Joseph Fleming Walsh, Soquel, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 366 days.

(21) Appl. No.: 13/791,470

(22) Filed: Mar. 8, 2013

(65) Prior Publication Data

US 2013/0255407 A1 Oct. 3, 2013

Related U.S. Application Data

(60) Provisional application No. 61/616,344, filed on Mar. 27, 2012, provisional application No. 61/738,351, filed on Dec. 17, 2012.

(51) Int. Cl.

*G03F 1/84* (2012.01)
*G03F 7/20* (2006.01)
*B25J 11/00* (2006.01)

(52) U.S. Cl.

CPC ....... *G03F 7/70691* (2013.01); *B25J 11/0095* (2013.01); *G03F 1/84* (2013.01); *G03F 7/70741* (2013.01)

(58) Field of Classification Search

CPC ..... G03F 1/62; G03F 1/64; G03F 1/66; G03F 1/84; G03F 7/70691; G03F 7/70733;

(Continued)

(56) References Cited

U.S. PATENT DOCUMENTS 5,608,773 A 3/1997 Korenaga et al.
5,674,039 A * 10/1997 Walker et al. ........... 414/222.05

(Continued)

FOREIGN PATENT DOCUMENTS

JP H07-153664 A 6/1995
JP H07-192984 A 7/1995
JP 2007-12942 A 1/2007

OTHER PUBLICATIONS

Supplementary European Search Report mailed on Oct. 13, 2015, for European Patent Application No. EP13769488, by KLA-Tencor Corporation, 2 pages.

(Continued)

*Primary Examiner* — Michael McCullough
*Assistant Examiner* — Brendan Tighe
(74) *Attorney, Agent, or Firm* — Spano Law Group; Joseph S. Spano

(57) ABSTRACT

Systems and methods to control particle generation in a reticle inspection system are presented. The number of particles added to a reticle during an entire load-inspect-unload sequence of a reticle inspection system is reduced by performing all reticle contact events in a controlled, flowing air environment. In one embodiment, the reticle is fixed to a carrier by clamping outside of the vacuum environment, and the carrier, rather than the reticle, is coupled to the reticle stage of the inspection system. In this manner, the high levels of back-side particulation associated with electrostatic chucking are avoided. In addition, the carrier is configured to be coupled to the reticle stage in any of four different orientations separated by ninety degrees.

17 Claims, 10 Drawing Sheets

(58) Field of Classification Search

CPC ............... G03F 7/70741; G03F 7/7075; G03F 7/70983; G03F 7/70991; H01L 21/67353; H01L 21/67393; H01L 21/67772; H01L 21/67778; H01L 21/68707; Y10S 414/135; Y10S 414/137; Y10S 414/139; Y10S 414/141

USPC .... 355/30, 76; 414/217, 217.1, 221, 222.01, 414/222.04, 226.05, 416.01, 779, 780, 414/781, 806, 935, 937, 939, 941

See application file for complete search history.

(56) References Cited

U.S. PATENT DOCUMENTS 6,003,828 A * 12/1999 Kawahashi ............... G03F 1/14 248/576
6,239,863 B1 5/2001 Catey et al.
6,364,595 B1 * 4/2002 Bonora ............... G03F 7/70741 294/106
6,492,067 B1 12/2002 Klebanoff et al.
6,646,720 B2 11/2003 Ramamoorthy et al.
6,734,445 B2 5/2004 Ramamoorthy et al.
6,906,783 B2 6/2005 del Puerto et al.
6,912,043 B2 6/2005 Galburt et al.
7,042,554 B2 5/2006 Galburt et al.
7,209,220 B2 4/2007 Puerto et al.
7,304,720 B2 12/2007 del Puerto et al.
7,413,586 B2 8/2008 Ramamoorthy et al.
7,453,549 B2 11/2008 Suzuki et al.
7,466,397 B2 * 12/2008 Van De Ven ........... G03F 7/707 355/72
7,477,358 B2 1/2009 Phillips et al.
7,804,583 B2 9/2010 Phillips et al.
8,207,504 B2 6/2012 Braude et al.
2003/0058424 A1 3/2003 Ramamoorthy et al.
2004/0218168 A1 11/2004 Van Groos et al.
2007/0002516 A1 * 1/2007 Matsumoto .................. 361/234
2011/0001955 A1 1/2011 Puerto et al.
2011/0121193 A1 5/2011 Braude et al.
2011/0180108 A1 7/2011 Pan et al.
2012/0042988 A1 2/2012 Shikata et al.

OTHER PUBLICATIONS

Meiling, Hans et al, "Extatic, ASML's a-tool development for EUVL," ASML, Emerging Lithography Technologies VI, Proceedings of SPIE vol. 4688 (2002).

Ota, Kazuya, "Evaluation Results of a new EUV Reticle Pod having Reticle Grounding Paths," Extreme Ultraviolet (EUV) Lithography II, Proc. of SPIE, vol. 7969, 2011.

Blum, Brian, et al, "ASML Approach to EUV Reticle Protection," Dallas 2002 EUV Symposium, Nov. 13, 2002.

* cited by examiner

APPARATUS AND METHODS FOR RETICLE HANDLING IN AN EUV RETICLE INSPECTION TOOL

CROSS REFERENCE TO RELATED APPLICATIONS

The present application for patent claims priority under 35 U.S.C. §119 from U.S. provisional patent application Ser. No. 61/616,344, entitled "Reticle Load From EIP Into Adapter In Atmosphere In EUV Reticle Inspection Tool," filed Mar. 27, 2012, and from U.S. provisional patent application Ser. No. 61/738,351, entitled "Reticle Load From EIP Into Adapter In Atmosphere In EUV Reticle Inspection Tool," filed Dec. 17, 2012, the entire subject matter of each is incorporated herein by reference.

TECHNICAL FIELD

The described embodiments relate to systems for specimen handling, and more particularly to particle management and specimen positioning in atmospheric and vacuum environments.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography, among others, is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

A lithographic process, as described above, is performed to selectively remove portions of a resist material overlaying the surface of a wafer, thereby exposing underlying areas of the specimen on which the resist is formed for selective processing such as etching, material deposition, implantation, and the like. Therefore, in many instances, the performance of the lithography process largely determines the characteristics (e.g., dimensions) of the structures formed on the specimen. Consequently, the trend in lithography is to design systems and components (e.g., resist materials) that are capable of forming patterns having ever smaller dimensions. In particular, the resolution capability of the lithography tools is one primary driver of lithography research and development.

Lithographic processes utilizing electromagnetic energy in the form of extreme ultraviolet (EUV) light are being developed for selective exposure of the resist. EUV radiation generated by an EUV radiation source is directed to a reticle surface, reflected from the reticle surface, and projected onto a wafer in a clean vacuum environment. The reticle surface is patterned and the reflected light projects this pattern onto the wafer. To achieve ever smaller patterned feature sizes, the feature sizes of reticle patterns continue to shrink. Consequently, particle contamination requirements on the reticle surface continue to become more stringent.

In traditional optical projection lithography, a pellicle is used to protect the reticle. This pellicle remains in place during all stages of the lithography process. When a pellicle is used, particles settle on the pellicle rather than the reticle. Cleaning the pellicle poses fewer dangers to the integrity of the reticle since the reticle is protected by the pellicle during any cleaning operations. The pellicle also minimizes the impact of particle contamination by separating any particles that have settled on its surface from the reticle pattern by a distance corresponding to the pellicle standoff-distance. This distance keeps the particles away from the image plane of the imaging system (the reticle patterned surface), thus minimizing their impact on the image projected onto the wafer.

Unfortunately, a pellicle is not currently used in EUV applications because the short wavelengths of light are easily absorbed when transmitted through gases or solids. Currently there are no robust materials sufficiently transparent to EUV that can be used to make a pellicle. Without available materials to cover the patterned surface of an EUV reticle to protect it from particle contamination, the patterned surface of EUV reticles is exposed to the process environment during lithographic operations and in some inspection operations. Although work is being done to identify a more robust, transmissive pellicle, even if such a pellicle were to become available, particle contamination requirements will remain stringent as feature sizes continue to shrink. As a result, maintaining particle control and cleanliness of EUV reticles both inside and outside semiconductor processing equipment is a significant issue.

In an effort to reduce particle contamination, a standard EUV pod (compliant with SEMI standard E152-0709) has been developed. An EUV pod includes an outer carrier, commonly referred to as a Reticle SMIF Pod (RSP), and an inner pod, commonly referred to as an EUV Inner Pod (EIP). The RSP is suitable for transporting EUV masks among different production stations and sites. The EIP is a protective enclosure that allows the reticle to remain within a protective environment until inside vacuum and near the reticle stage. During pumpdown to vacuum or vent to atmospheric pressure, particles can be stirred up and deposited onto a reticle surface. The EIP allows the reticle to remain within a protective environment until inside vacuum and near the stage. A number of publications describe the development of an EUV Inner Pod (EIP) to protect the reticle. Exemplary publications include: "EXTATIC, ASML's—tool development for EUVL," Hans Meiling, et al., Emerging Lithographic Technologies VI, Proceedings of SPIE, Vol. 4688 (2002), "Evaluation Results of a New EUV Reticle Pod Having Reticle Grounding Paths," Kazuya Ota, et al., Extreme Ultraviolet (EUV) Lithography II, Proceedings of SPIE, Vol. 7969 (2011), and "ASML Approach to EUV Reticle Protection," Brian Blum, et al., presentation at Dallas EUV Symposium, Nov. 13, 2002, the entire subject matter of each is incorporated herein by reference.

Traditionally, the EIP is opened in vacuum to allow the reticle to be loaded onto an electrostatic chuck. The use of an electrostatic chuck is expensive and creates many particles that accumulate on the backside of the reticle. Alternatively, the reticle may be loaded directly onto the reticle stage using a clamp mechanism. This has a number of disadvantages. First, the clamping process generates a significant number of particles. In the clean vacuum environment required for EUV lithographic or inspection processing, control of these particles is difficult. Moreover, the generation of these particles in the processing environment is undesirable. Second, the EIP was developed specifically for use with a reticle stage with an electrostatic chuck. The limitations of the EIP design make it difficult to use in applications with a different method of holding the reticle, namely clamping. This complicates the stage design and also makes it difficult to control particles created during the clamping process.

The importance of inspection of EUV reticles continues to grow as the dimensions of semiconductor devices continue to shrink. Improved methods and systems for handling EUV reticles in a reticle inspection system that minimize the number of particles added to the reticle are desired.

SUMMARY

Particle generation during reticle handling operations presents a significant risk of undesirable contamination of unprotected EUV reticles. Systems and methods to control particle generation in a reticle inspection system are presented.

In one aspect, the number of particles added to a reticle during an entire load-inspect-unload sequence of a reticle inspection system is reduced by performing all reticle contact events in a controlled, flowing air environment, rather than in a vacuum environment where particle control is difficult.

In one further aspect, the reticle is fixed to a reticle carrier by clamping outside of the vacuum environment, and the reticle carrier, rather than the reticle, is coupled to the reticle stage of the inspection system. In this manner, the high levels of back-side particulation associated with electrostatic chucking are avoided.

In another further aspect, the reticle carrier is configured to be kinematically coupled to the reticle stage. The use of a kinematic coupling between the reticle carrier and the reticle stage puts significant distance between the particle generating contact events and the reticle surfaces. Moreover, the reticle carrier design shields the entire reticle from particles generated by the loading of the reticle carrier onto the reticle stage.

In yet another further aspect, the reticle carrier is configured to be kinematically coupled to the reticle stage in any of four different orientations separated by ninety degrees. The resulting four-way symmetry increases reticle inspection flexibility by allowing the reticle to be presented for inspection in any of four orthogonal orientations, without any additional contact events on the reticle itself.

The foregoing is a summary and thus contains, by necessity, simplifications, generalizations and omissions of detail. Consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Figure 1:
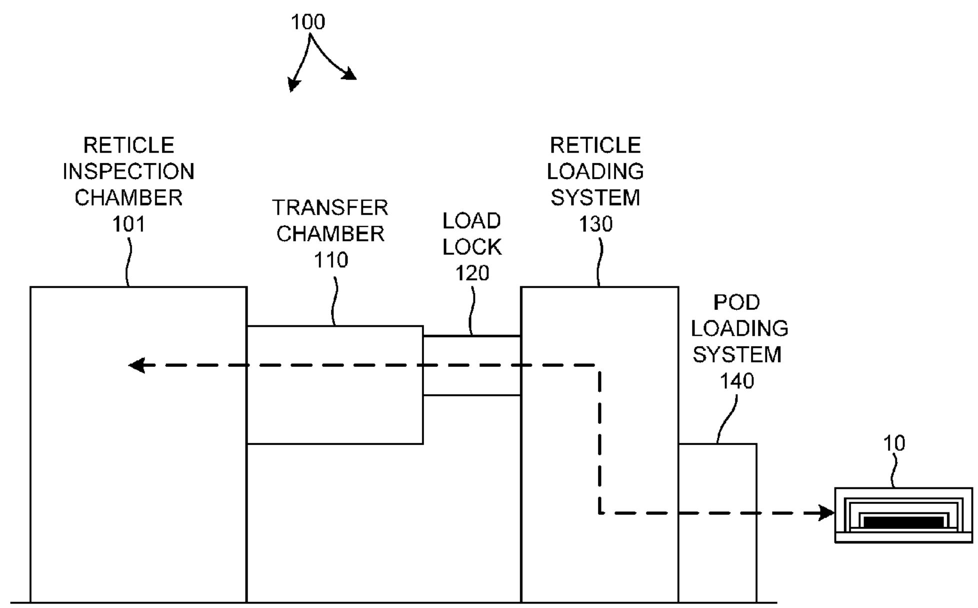
FIG. 1 is a simplified schematic view of a reticle inspection system 100 that may be used to implement reticle handling methods described herein in one exemplary embodiment.
Figure 2:
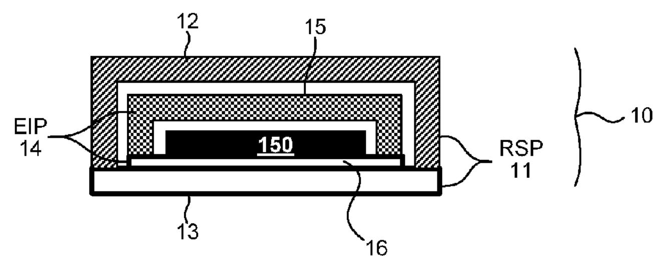
FIG. 2 is a diagram illustrative of an EUV reticle pod 10 suitable for transportation of a reticle in an ambient environment in one exemplary embodiment.

FIG. 1 is a simplified schematic view of one embodiment of a reticle inspection system 100 that may be used to perform reticle handling methods described herein. The system 100 includes a pod loading system 140, a reticle loading system 130, a load lock 120, a transfer chamber 110, and a reticle inspection chamber 101. The dashed line generally illustrates the movement of a reticle through system 100 from entry at the pod loading system 140 to the reticle inspection chamber 101, and back out again. FIG. 2 is a diagram illustrating an EUV reticle pod 10 suitable for transportation of reticles (e.g., reticle 150) in the ambient environment. In general, a reticle 150 is stored in an EUV Inner Pod (EIP) 14. EIP 14 includes an EIP base 16 and an EIP cover 15. Reticle 150 is stored face down in EIP 14. More specifically, the printed surface of reticle 150 faces EIP base 16 and the backside of reticle 150 faces EIP cover 15. EIP base 16 includes features to fix the position of reticle 150 during transport. EIP cover 15 clamps to EIP base 16, effectively sandwiching reticle 150 between EIP base 16 and EIP cover 15. EIP 14 itself is contained by an outer pod, sometimes referred to as a Reticle SMIF Pod (RSP) 11. RSP 11 includes a RSP base 13 and a RSP cover 12. Similarly, RSP base 13 clamps to RSP cover 12, effectively sandwiching EIP 14 between RSP base 13 and RSP cover 12.

The inner and outer EUV pods are designed in a manner that facilitates their opening, closing, and general manipulation. For example, the inner and outer EUV pods may be designed to include robotic handling flanges, latch-pin holes, pins, conveyor rails, end effector exclusion volumes, secondary and primary side robotic handling flanges, features for reticle alignment and data matrix identification, registration pin features, features which mate with kinematic-coupling pins, and the like. The known opening and closing techniques for the inner and outer EUV pods may be applied by any of the handling mechanisms of reticle inspection system 100. The description of an EUV pod in this patent document is provided by way of non-limiting example and generally tracks the current standard for EUV pods promulgated for industry use (e.g., SEMI standard E152-0709). However, many other EUV pod designs that include a cover and base may be contemplated. The methods and apparatus described in this patent document apply to these EUV pod designs in an analogous manner.

In one aspect, the number of particles added to a reticle during an entire load-inspect-unload sequence of a reticle inspection system is reduced by performing all reticle contact events (e.g., clamping, grounding, etc.) in a controlled, flowing air environment. In this manner, particles created at every reticle contact event are more effectively controlled than in a vacuum environment. In a further aspect, the reticle is fixed to a carrier by clamping, and the carrier is coupled to the reticle stage for inspection. In this manner, the high levels of back-side particulation associated with electrostatic chucking are avoided. In yet another further aspect, the carrier is coupled to the reticle stage by a kinematic mount that allows for orientation of the carrier with respect to the reticle stage in any of four orthogonal orientations.

Figure 13:
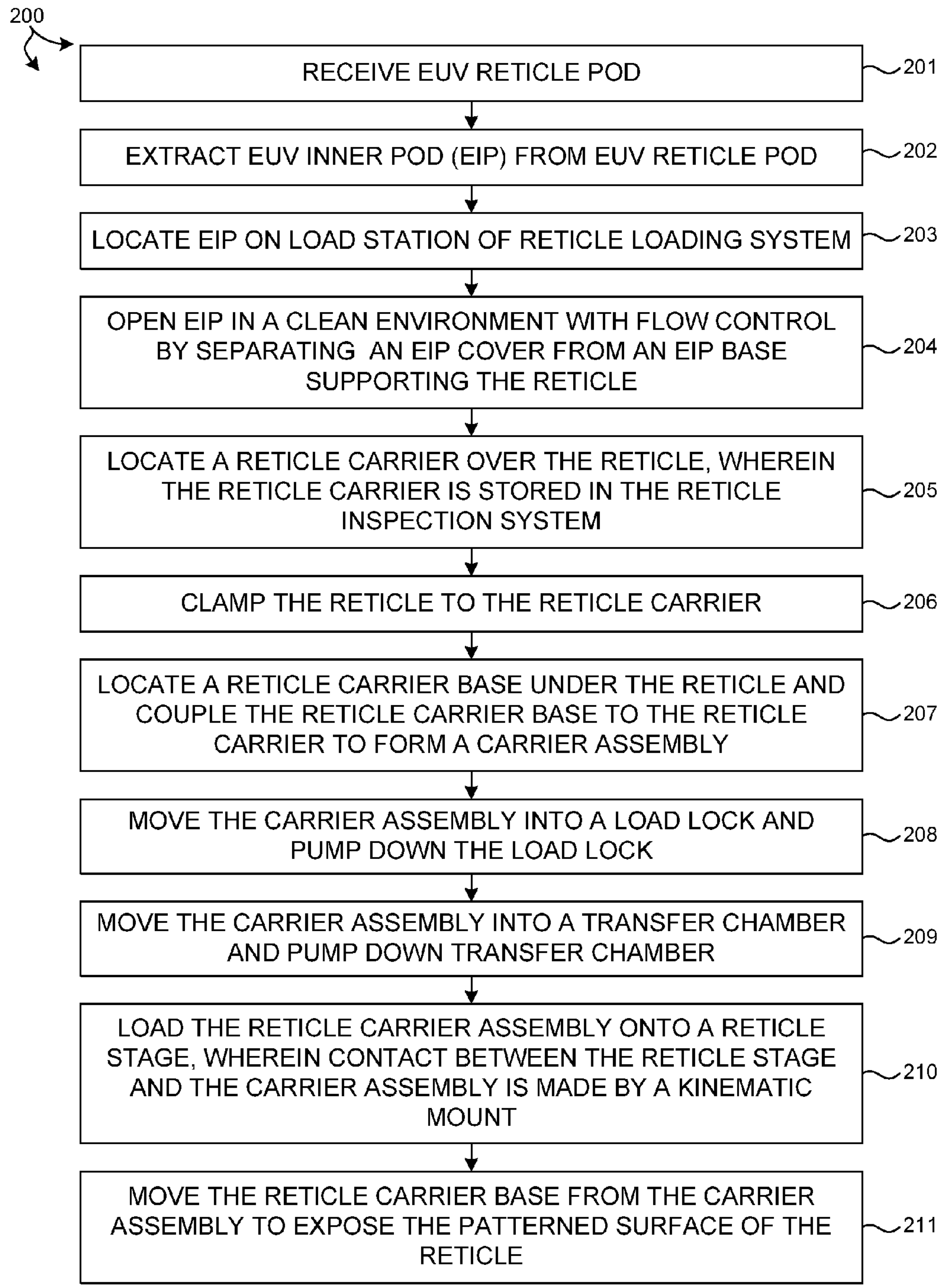
FIG. 13 is a flowchart illustrative of one exemplary method 200 of loading a reticle into a reticle inspection system in at least one novel aspect.

FIG. 13 illustrates a flowchart of an exemplary method 200 useful for loading a reticle onto a reticle stage of a reticle inspection system for inspection in several novel aspects. By way of non-limiting example, method 200 is described with reference to the reticle inspection system 100 illustrated in FIG. 1 for explanatory purposes. Although, the description of reticle inspection system 100 includes references to specific hardware elements employed to achieve the elements of method 200, many other hardware elements known to persons of ordinary skill in the art may be contemplated to achieve an analogous result. Hence, any of the referenced hardware elements presented herein may be substituted, consolidated, modified, or eliminated without exceeding the scope of the description provided herein. Similarly, some of the elements of method 200 and the order of presentation of the elements of method 200 relate to the use of specific hardware elements described with reference to reticle inspection system 100. However, as many other hardware elements known to persons of ordinary skill in the art may be contemplated to achieve an analogous result, some of the method elements and the order of presentation of the method elements may be substituted, consolidated, modified, or eliminated without exceeding the scope of the description provided herein.

In block 201, an EUV reticle pod 10 is received by pod loading system 140 of reticle inspection system 100. In some embodiments, EUV reticle pod 10 is manually carried to pod loading system 140 and inserted into a load port of the pod loading system 140. In some other embodiments, an automated transport system installed in a semiconductor fabrication facility carries the EUV reticle pod 10 to pod loading system 140 and inserts the pod into a load port of the pod loading system 140. A manipulator (not shown) of pod loading system 140 receives the EUV reticle pod 10 at the load port and brings the pod into the system 140 for further processing.

In block 202, the pod loading system 140 extracts the EUV Inner Pod (EIP) from the EUV reticle pod 10. One or more manipulators of pod loading system 140 remove the RSP cover 12 from the RSP base 13 and remove EIP 14 from the RSP base 13. In some embodiments, the RSP cover 12 and RSP base 13 are placed into storage in pod loading system 140, and EIP 14 is positioned for transfer to reticle loading system 130.

In block 203, the EIP 14 is loaded onto a load station of reticle loading system (RLS) 130. In one embodiment, a RLS manipulator (not shown), moves the EIP 14 from pod loading system 140 to a loading station 136 illustrated in FIG. 3. Loading station 136 includes structural elements 137 (e.g., tabs, kinematic mounting points, etc.) that support EIP 14 within loading station 136. The RLS manipulator moves EIP 14 over structural elements 137 and lowers EIP onto structural element 137, thus transferring the load from the manipulator to the loading station 136.

Figure 3:
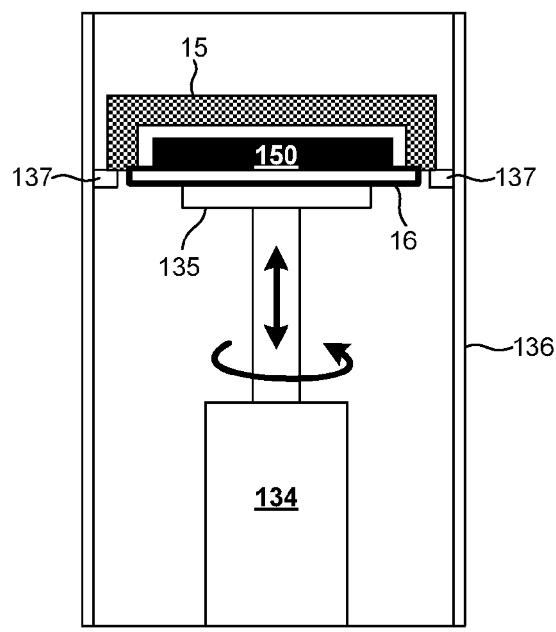
FIG. 3 is a diagram illustrative of an EIP 14 loaded onto a load station of a reticle loading system (RLS) 130 in one exemplary embodiment.
Figure 4:
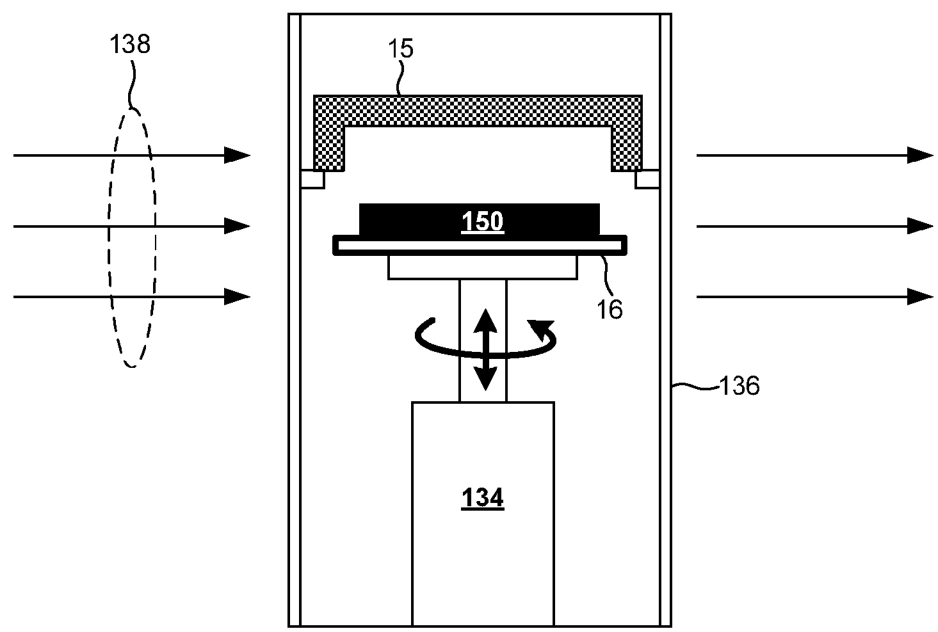
FIG. 4 is a diagram illustrative of an EIP cover 15 removed from EIP base 16, exposing the backside of reticle 150 in one exemplary embodiment.

In block 204, the EIP is opened in a clean environment with flow control by separating the EIP cover 15 from the EIP base 16 that supports reticle 150. As illustrated in FIG. 3, loading station 136 includes a manipulator 134 operable to rotate and translate its end effector 135. The manipulator 134, as depicted, may be commonly referred to as a piston turntable. Manipulator 134 translates upward to engage EIP base 16. EIP cover 15 is disengaged from EIP base 16. Manipulator 134 translates downward, away from EIP cover 15, as illustrated in FIG. 4. In this manner, EIP 14 is opened, exposing the backside of reticle 150.

It is important to note that EIP 14 is opened in a clean air environment designed to control particles generated by moving and opening EIP 14. Particles are generated at every engagement and disengagement between mechanical elements. The importance of controlling these particles grows when the reticle is not protected and when the contact events occur close to the reticle. Of particular importance are contact events that occur over the reticle where gravitational forces promote the settling of particles down onto the reticle.

An important aspect of the methods and apparatus described herein is that many particle generating events related to manipulation of the EIP 14 take place in a controlled atmosphere, rather than in vacuum, as is common in existing reticle handling schemes. Although EIP 14 is designed to remain relatively clean during its operational lifetime, a significant number of particles tend to accumulate on the EIP 14. It is desirable to keep these particles outside of the clean vacuum environment where particle control is much more difficult to achieve and the impact of contamination is more acute. RLS 130 includes a controlled flow 138 of clean, dry air to sweep away particles generated by the presence of EIP 14 and the manipulation of EIP 14. In this manner, the number of particles that reach an exposed surface of reticle 150 is minimized.

After opening EIP 14, the backside of reticle 150 is exposed. In some embodiments, the backside of reticle 150 is inspected for particles. The results of the particle inspection may preclude the reticle from further use until appropriate cleaning steps have been taken. For example, if the size or number of backside particles exceeds a threshold value, the reticle may be treated with a controlled blast of clean, dry air in an attempt to dislodge the particles. In some other examples, the reticle may be reloaded into EIP 14 and removed from the reticle inspection system 100 entirely for further cleaning.

Figure 5:
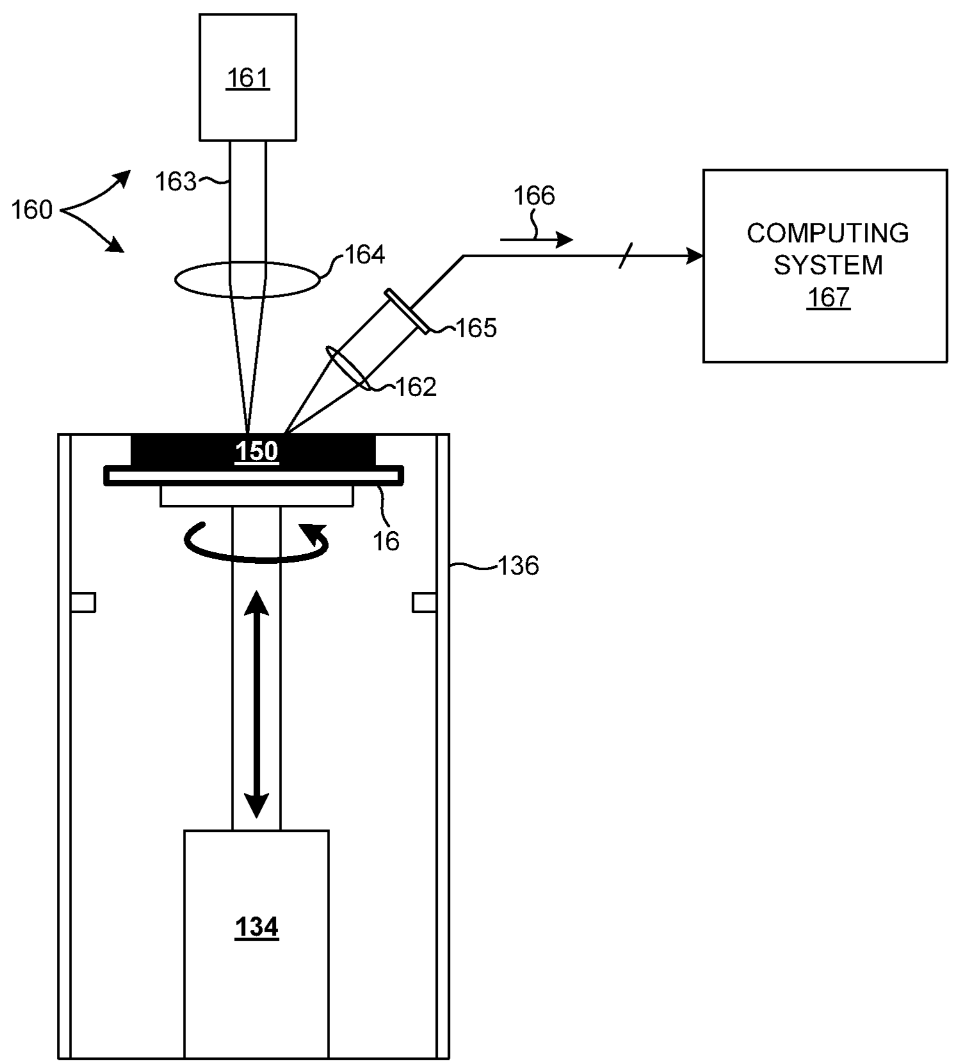
FIG. 5 illustrates a simplified schematic of a backside particle inspection system 160 positioned to inspect the backside of reticle 150 in one exemplary embodiment.

FIG. 5 illustrates a simplified schematic of a backside particle inspection system 160 positioned to inspect the backside of reticle 150. In some embodiments, reticle 150 may be moved into an inspection position of loading station 136 by manipulator 134 for inspection by system 160. In some other embodiments, reticle 160 may be moved to another station for inspection by system 160. System 160 is configured as a scanning system. Thus, the inspection spot (or spots) of system 160 are moved relative to the backside surface of reticle 150. In the depicted embodiment, the reticle is rotated by manipulator 134 while the incident beam is translated across the rotating surface of reticle 150. In this manner, the entire backside surface of reticle 150 is inspected. Many other embodiments useful to position the surface of reticle 150 for scanning inspection may be contemplated.

As illustrated in FIG. 5, reticle 150 is illuminated by a normal incidence beam 163 generated by one or more illumination sources 161. Alternatively, the illumination subsystem may be configured to direct the beam of light to the specimen at an oblique angle of incidence. In some embodiments, system 160 may be configured to direct multiple beams of light to the specimen such as an oblique incidence beam of light and a normal incidence beam of light. The multiple beams of light may be directed to the specimen substantially simultaneously or sequentially.

Illumination source 101 may include, by way of example, a laser, a diode laser, a helium neon laser, an argon laser, a solid state laser, a diode pumped solid state (DPSS) laser, a xenon arc lamp, a gas discharging lamp, and LED array, or an incandescent lamp. The light source may be configured to emit near monochromatic light or broadband light. In general, the illumination subsystem is configured to direct light having a relatively narrow wavelength band to the specimen. Therefore, if the light source is a broadband light source, the illumination subsystem may also include one or more spectral filters that may limit the wavelength of the light directed to the specimen. The one or more spectral filters may be bandpass filters and/or edge filters and/or notch filters.

Normal incidence beam 163 is focused onto the backside of reticle 150 by an objective lens 164. System 160 includes collection optics 162 to collect the light scattered and/or reflected by reticle 150 during the scan and focus that light onto a detector array 165. The output signals 166 generated by detector array 165 are supplied to a computing system 167 for processing the signals and determining the presence of particles on the backside of reticle 150. Backside particle inspection system 160 is presented herein by way of non-limiting example, as many other suitable inspection systems may be contemplated.

Figure 6:
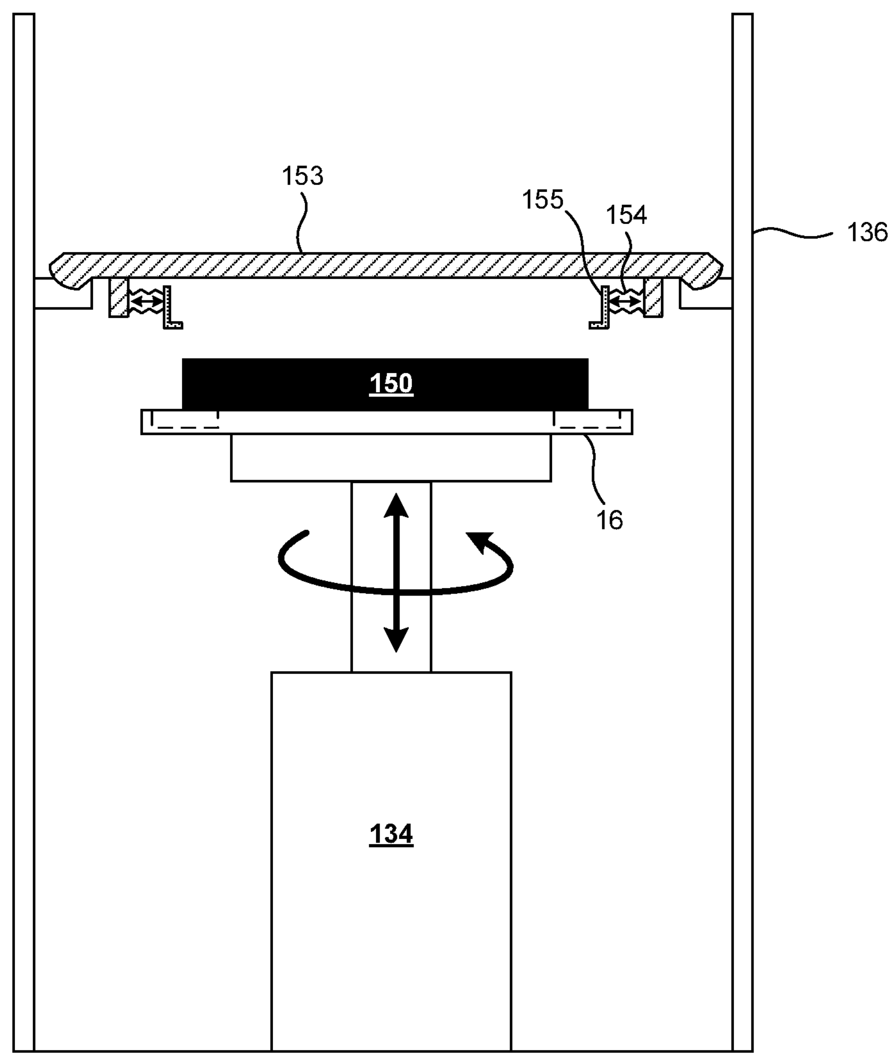
FIG. 6 is a diagram illustrative of a reticle carrier 153 located over reticle 150 in one exemplary embodiment.

In block 205, a reticle carrier is located over the reticle. As illustrated in FIG. 6, reticle carrier 153 is located over reticle 150. In the depicted embodiment, EIP cover 15 is moved from loading station 136 into storage and reticle carrier 153 is moved from storage in RLS 130 to loading station 136 by the RLS manipulator.

It is important to note that reticle carrier 153 is stored within reticle inspection system 100 during normal operation. Thus, reticle carrier 153 remains in a clean, dry environment, or a clean vacuum environment at all times. In this manner, reticle carrier 153 remains in a relatively clean (fewer accumulated particles than an EIP) and relatively dry (less accumulated moisture than an EIP). The relatively clean reticle carrier 153 lowers the risk of particle contamination of the reticle 150 and the sensitive optical elements of the reticle inspection system 100. The relatively dry reticle carrier 153 reduces the amount of time it takes to pump down to clean vacuum during the transition from the RLS 130 to the reticle inspection chamber 101.

Figure 7:
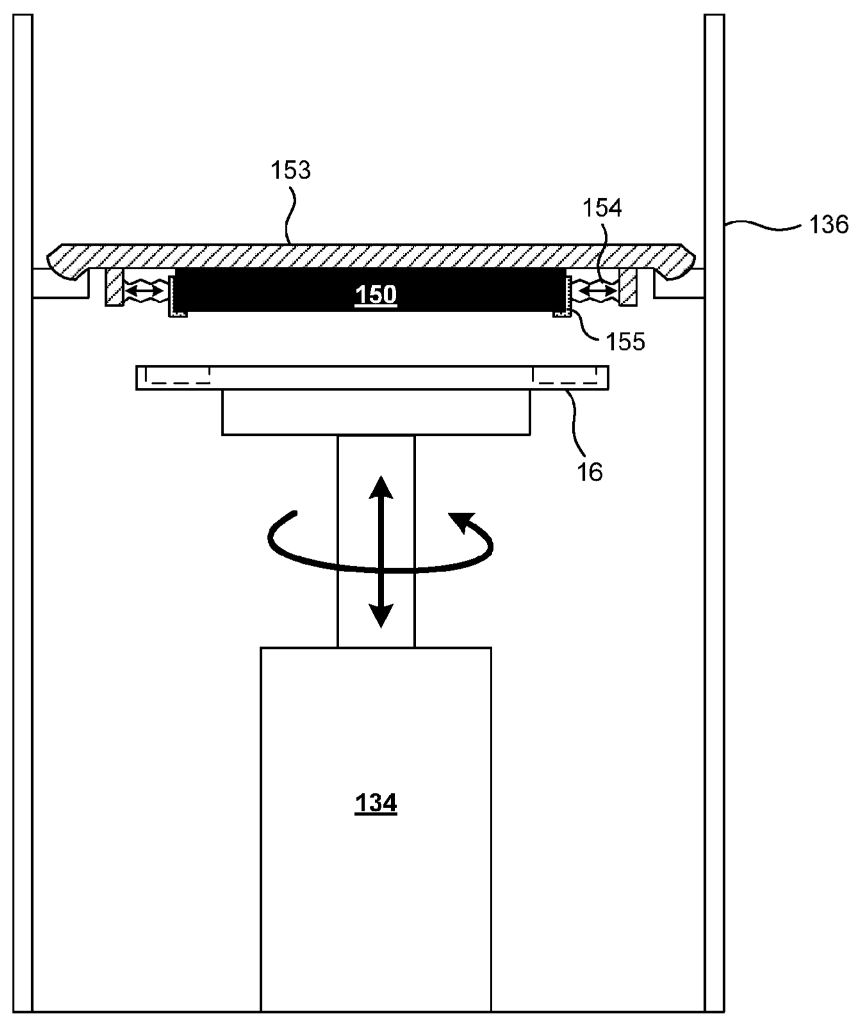
FIG. 7 is a diagram illustrative of a reticle carrier 153 including reticle clamping elements 155 that are moveable relative to clamp reticle 150 to reticle carrier 153 in one exemplary embodiment.
Figure 8:
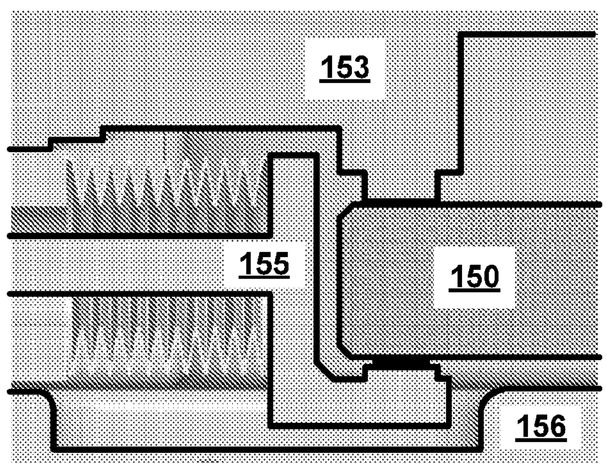
FIG. 8 is a diagram illustrative of the reticle carrier of FIG. 7 in greater detail in one exemplary embodiment.

In block 206, the reticle is clamped to the reticle carrier. In the depicted embodiment, manipulator 134 moves EIP base 16 and reticle 150 toward reticle carrier 153 resting on loading station 136. As illustrated in FIG. 7, reticle carrier 153 includes reticle clamping elements 155 that are moveable relative to reticle carrier 153 by actuators 154. Manipulator 134 moves reticle 150 within the grasp of clamping elements 155 and then actuators 154 move clamping elements 155 from a disengaged position to an engaged position that effectively clamps reticle 150 to reticle carrier 153. Manipulator 134 then moves EIP base 16 away from reticle 150. FIG. 8 illustrates a clamping element 155 in the engaged position, effectively clamping reticle 150 to features of carrier element 153.

It is important to note that the clamping of reticle 150 to reticle carrier 153 is the only contact event that directly involves reticle 150 during the loading sequence described herein. As discussed hereinbefore, this contact event takes place in a controlled environment that includes a dry air flow to sweep particles generated by the clamping process away from reticle 150.

At this point, the front side (patterned side) of reticle 150 is exposed. In some embodiments, images of the front side of reticle 150 are captured to establish reference locations and the orientation of reticle 150 with respect to reticle carrier 153. This information may be used later in the process to correct small misalignments. This information may also be used later in the process to determine further manipulations necessary to present reticle 150 to the reticle stage in any of four orientations each separated by ninety degrees.

In block 207, a reticle carrier base is located under the reticle and coupled to the reticle carrier to form a carrier assembly that contains the reticle 150. As illustrated in FIG. 8, EIP base 16 is moved downward, clear of reticle carrier 153. The RLS manipulator (end effector 131 of RLS manipulator shown) retrieves reticle carrier base 156 from storage, moves the reticle carrier base 156 under reticle 150, and lifts the reticle carrier base 156 upward into contact with the reticle carrier 153. The reticle carrier base 156 is effectively coupled to reticle carrier 153 to form a carrier assembly 157 that contains reticle 150. It is important to note that reticle 150 is clamped to reticle carrier 153, not reticle carrier base 156. In other words, as illustrated in FIG. 8, features of reticle carrier 153 fixedly couple reticle 150 to reticle carrier 153 by the clamping action of clamping elements 155. Moreover, the area of contact between reticle carrier 153 and reticle 150 is much less than an electrostatic chuck. The reduced contact area generates fewer particles during the clamping process and also reduces the risk of entrapment of large particles between the contacting surfaces of the reticle 150 and the reticle carrier 153 that could cause misalignment.

Figure 9:
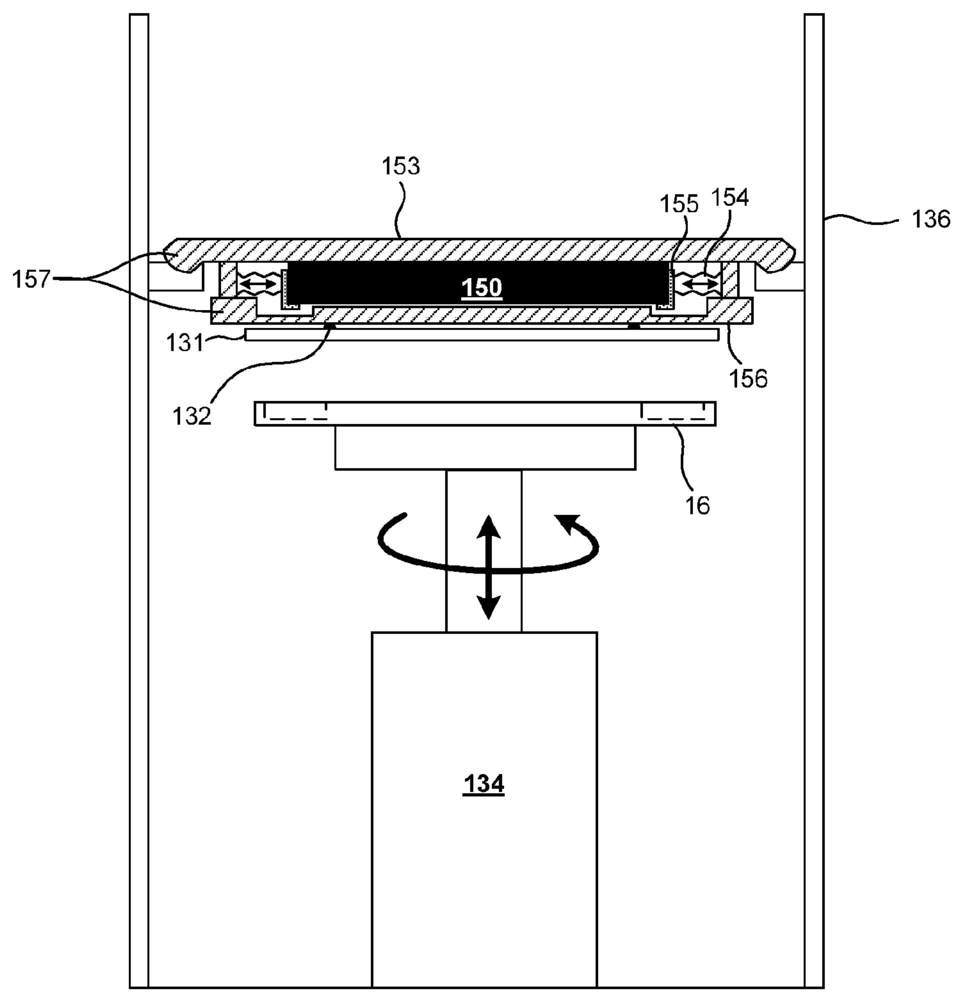
FIG. 9 is a diagram illustrative of the reticle 150 after being clamped into the reticle carrier top 153 and closed in by reticle carrier base 156 arranged on the top surface of end effector 131
Figure 12:
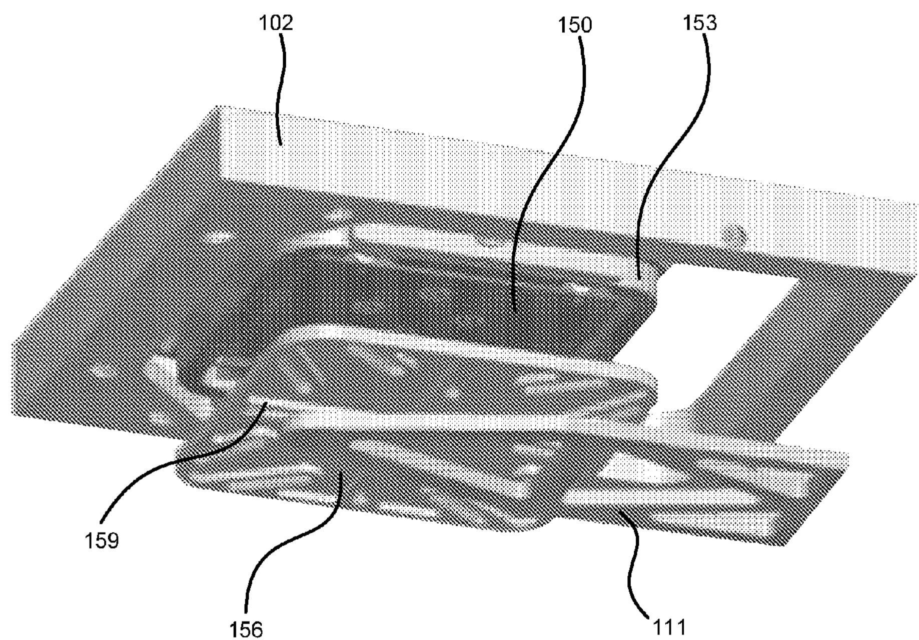
FIG. 12 is a diagram illustrative of a kinematic handoff of the carrier top 153 from the end effector 111 to the reticle stage 102 in one exemplary embodiment.

In another further aspect, reticle carrier base 156 includes features that enable the carrier assembly 157 to engage with the end effector 131 of the RLS manipulator in any of four orientations each separated by ninety degrees. As illustrated in FIG. 12, slot features such as the slot feature 159 are arranged to create a kinematic mount between reticle carrier base 156 and end effector 131. More specifically, three spherically shaped mounting elements (see spherically shaped mounting element 132 illustrated in FIG. 9) are arranged in a triangular pattern on the top surface of end effector 131. When end effector 131 is engaged with reticle carrier base plate, each spherically shaped mounting element makes a two point contact with a corresponding slot feature to form a kinematic coupling. A resulting kinematic coupling constrains the six degrees of freedom of the reticle carrier base plate 156 with respect to the end effector 131 without overconstraint. The slot features of reticle carrier base plate 156 are arranged such that the end effector 131 is able to make a kinematic coupling with carrier base plate 156 in any of four different orientations, each separated by ninety degrees.

Figure 10:
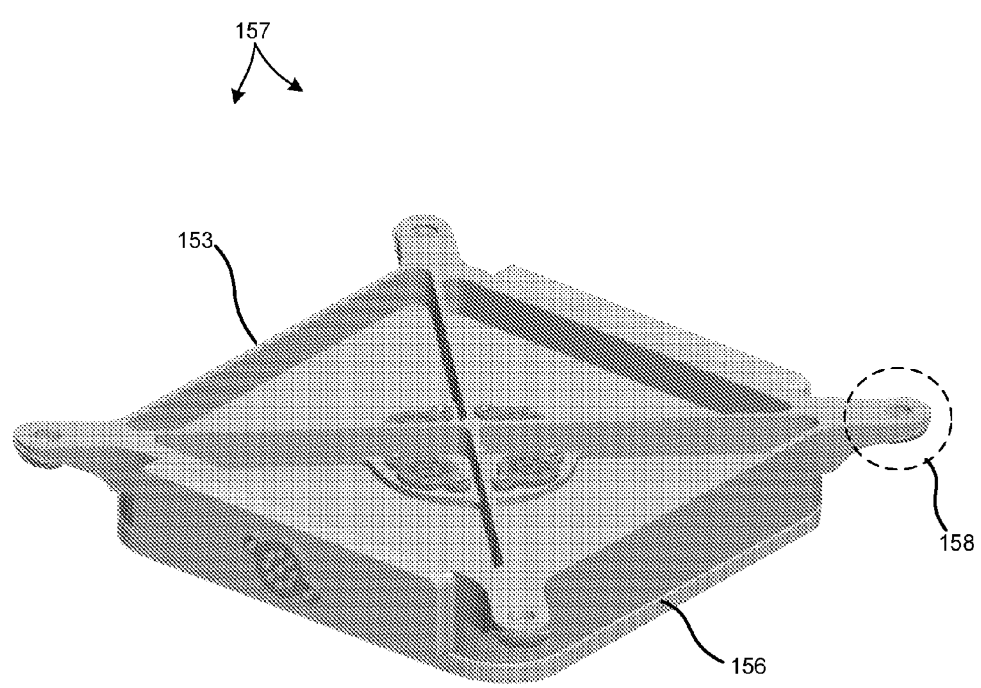
FIG. 10 is a diagram illustrative of spherically shaped mounting elements 158 arranged on the top surface of the carrier top in one exemplary embodiment.

In another further aspect, reticle carrier 153 is rotationally symmetric in ninety degree increments and can be oriented on a frame (e.g., loading station 136 or reticle stage 102) in any of four different orientations separated by ninety degrees. In the embodiment depicted in FIG. 10, reticle carrier 153 includes spherical features 158 mounted to each corner in a square pattern. In this manner, a frame supporting reticle carrier 153 can support reticle carrier 153 in any of four different orientations separated by ninety degrees with only one set of support features.

In some embodiments, the carrier assembly 157 may be reoriented in one of the four different orientations separated by ninety degrees. In one example, manipulator 134 engages with carrier assembly 157, lifts the assembly 157 from loading station 136, rotates carrier assembly 157 to the desired orientation, and sets the carrier assembly 157 back down onto loading station 136. In some other embodiments, carrier assembly 157 may be moved to another station for reorientation.

In block 208, the carrier assembly is moved into a load lock and the load lock is pumped down. In the depicted embodiment, RLS manipulator lifts carrier assembly 157 from loading station 136 and moves the carrier assembly 157 to a support frame inside load lock 120. The load ports of load lock 120 are sealed, and load lock 120 is pumped down. As discussed hereinbefore, the time it takes to pump down load lock 120 is reduced because the elements of the carrier assembly 157 are stored in the controlled environment of reticle inspection system 100.

In another further aspect, carrier assembly 157 includes the particle management features of an EIP to maintain reticle protection during transport, pump down, and venting operations.

In block 209, the carrier assembly is moved into a transfer chamber and the transfer chamber is pumped down. In the depicted embodiment a transfer chamber manipulator (not shown) moves carrier assembly 157 from load lock 120 to transfer chamber 110. During the time carrier assembly 157 spends inside transfer chamber 110, additional pumping takes place (e.g., molecular pumping) to remove additional contaminants and achieve suitable clean vacuum conditions.

In some examples, the carrier assembly is stored in a transfer chamber storage pod (not shown) until ready for use. In a further example, a transfer chamber storage pod includes a rotation stage to rotate the carrier assembly 157 in any of four orientations separated by ninety degrees. In this manner, the orientation of reticle 150 may be changed in the clean vacuum environment of transfer chamber 120 without having to move the carrier assembly back out of vacuum to the reticle loading system 130. This may be advantageous when successive measurements of reticle 150 are performed in different orientations.

Figure 11:
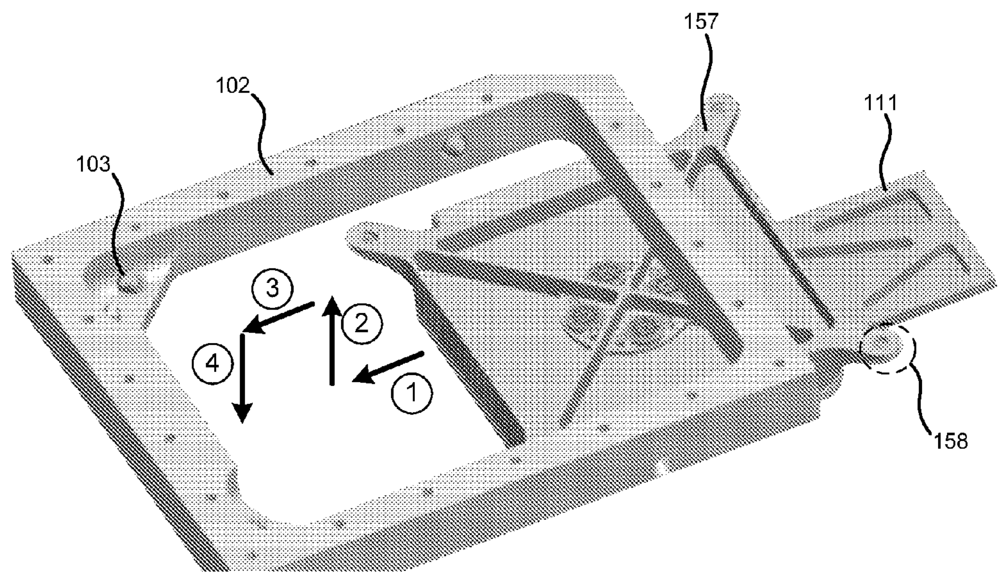
FIG. 11 is a diagram illustrative of a series of four movements to load a reticle carrier assembly 157 onto a reticle stage 102 in one exemplary embodiment.

In block 210, the reticle carrier assembly is loaded onto the reticle stage. In the depicted embodiment, the transfer chamber manipulator moves the reticle carrier assembly 157 from the transfer chamber into the reticle inspection chamber 101. As depicted in FIG. 11, end effector 111 of the transfer chamber manipulator loads the reticle carrier assembly 157 onto reticle stage frame 102 with a series of four movements. In a first movement, the transfer chamber manipulator moves the reticle carrier assembly 157 in a horizontal direction, underneath reticle stage 102. In a second movement, the manipulator moves the assembly 157 in a vertical direction, through an opening in the reticle stage 102. In a third movement, the manipulator moves the assembly in a horizontal direction, aligning the mounting features of the reticle carrier 153 over corresponding mounting features of reticle stage 102. In a fourth movement, the manipulator lowers the reticle carrier assembly 157 onto reticle stage 102. In some other embodiments any of the horizontal movements of the manipulator may be partially or completely replaced by corresponding horizontal movements of reticle stage 102.

In another further aspect, reticle carrier 153 is coupled to reticle stage 102 by a kinematic mount. In other words, the six degrees of relative motion between reticle carrier 153 and reticle stage 102 are determined by their respective mounting features without overconstraint. In the illustrated embodiment, gravity maintains contact between reticle carrier 153 and reticle stage 102 in the absence of support by the transfer chamber manipulator. In some other embodiments an additional locking (e.g., clamping) mechanism is included to ensure contact is maintained during operation. In the embodiment depicted in FIG. 11, six flat features (e.g., flat feature 103) are arranged at four locations that correspond to the spherical features 158 mounted to each corner of reticle carrier 153. The flat features are arranged such that they each contact a corresponding spherical feature of reticle carrier 153 to create a kinematic mount for any of the four different orientations separated by ninety degrees. The depicted kinematic mount is provided by way of example, as many other kinematic mounting arrangements may be contemplated to fixedly couple reticle carrier 153 to reticle stage 102.

In block 211, the reticle carrier base is moved away from the carrier, leaving the patterned surface of the reticle exposed for inspection by reticle inspection system 100. As depicted in FIG. 12, end effector 11 of the transfer chamber manipulator is lowered to decouple reticle carrier base 156 from reticle carrier 153. As a result, the patterned surface of reticle 150 is exposed (facing downward) and is ready for inspection. The exposed, patterned surface of reticle 150 does not have any protective element (i.e., pellicle-like feature) between the patterned surface and the optical elements of the reticle inspection system 100. In this manner, optical losses and image distortions are minimized.

In some embodiments, reticle stage 102 moves from a loading position, where the reticle carrier 153 is loaded, to a process area where inspection takes place. The loading position is configured such that the sensitive optical elements of the reticle inspection system 100 are protected from particles that may be generated during loading and unloading of the reticle carrier 153.

Reticle carrier 153 is configured with spherical features 158 at the furthest corners of reticle carrier 153 to put the greatest amount of distance possible between the reticle 150 and the particle generating contact events associated with the loading and unloading of the reticle carrier (in addition to allowing the 90 degree rotation capability). In addition, reticle 150 is mounted to reticle carrier 153 in such a way that there is no direct path between the spherical features 158 and the backside of reticle 150. In this manner, particle accumulation on the backside of reticle 150 is minimized.

Figure 14:
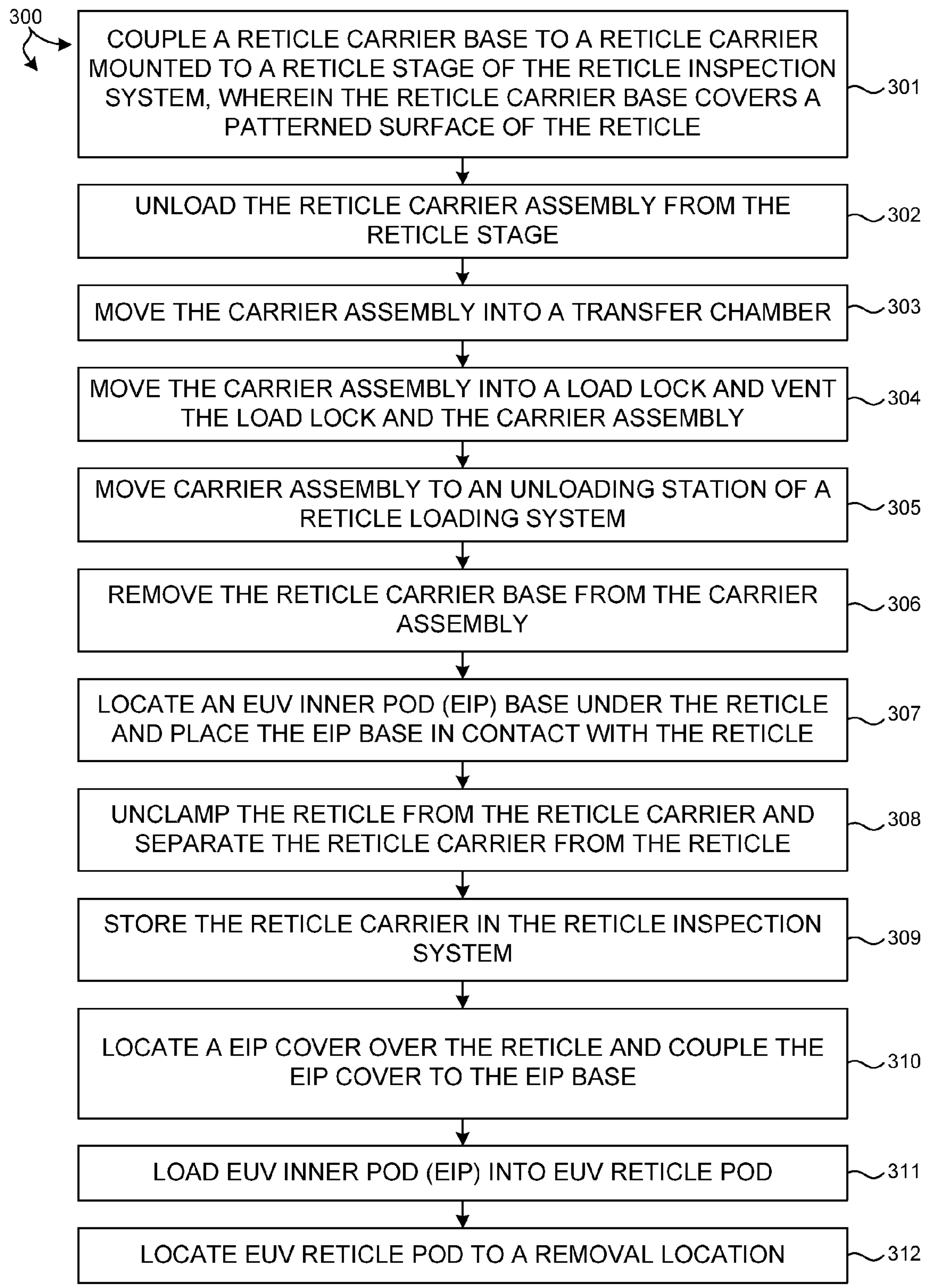
FIG. 14 is a flowchart illustrative of one exemplary method 300 of unloading a reticle from a reticle inspection system in at least one novel aspect.

FIG. 14 illustrates a flowchart of an exemplary method 300 useful for unloading a reticle from a reticle stage of a reticle inspection system in several novel aspects. By way of non-limiting example, method 300 is described with reference to the reticle inspection system 100 illustrated in FIG. 1 for explanatory purposes. Although, the description of reticle inspection system 100 includes references to specific hardware elements employed to achieve the elements of method 300, many other hardware elements known to persons of ordinary skill in the art may be contemplated to achieve an analogous result. Hence, any of the referenced hardware elements presented herein may be substituted, consolidated, modified, or eliminated without exceeding the scope of the description provided herein. Similarly, some of the elements of method 300 and the order of presentation of the elements of method 300 relate to the use of specific hardware elements described with reference to reticle inspection system 100. However, as many other hardware elements known to persons of ordinary skill in the art may be contemplated to achieve an analogous result, some of the method elements and the order of presentation of the method elements may be substituted, consolidated, modified, or eliminated without exceeding the scope of the description provided herein.

In block 301, a reticle carrier base is coupled to a reticle carrier mounted to the reticle stage. The reticle carrier base covers the exposed, patterned surface of the reticle. In the depicted embodiment, end effector 11 (illustrated in FIG. 12) of the transfer chamber manipulator retrieves the reticle carrier base 156, passes under reticle carrier 153 and lifts upward to couple reticle carrier base 156 to reticle carrier 153. As a result, the patterned surface of reticle 150 is covered and is ready for removal from the reticle stage 102.

In block 302, the reticle carrier assembly is removed from the reticle stage. In the depicted embodiment, the transfer chamber manipulator removes the reticle carrier assembly 157 from the reticle stage 102 by reversing the order of the series of four movements described with reference to method 200.

In block 303, the carrier assembly is moved into the transfer chamber. In the depicted embodiment, the transfer chamber manipulator moves the reticle carrier assembly 157 into the transfer chamber 110 after removing the reticle carrier assembly 157 from reticle stage 102.

In block 304, the carrier assembly is moved into a load lock and the load lock and carrier assembly are vented. In one embodiment, the transfer chamber manipulator moves the carrier assembly 157 from the transfer chamber 110 to the load lock 120. In some examples, the carrier assembly 157 is moved directly from the reticle inspection chamber 101 to load lock 120. In some other examples, the carrier assembly 157 is moved to a transfer chamber storage pod and then later moved from the storage pod to load lock 120.

In block 305, the carrier assembly is moved to an unloading station of a reticle loading system. In the depicted embodiment, the loading station 136 also serves as an unloading station. The carrier assembly 157 is removed from the load lock by the RLS manipulator and placed on station 136. Although in some embodiments the loading station and the unload station are the same station, in some other embodiments, separate loading and unloading stations may be employed.

In block 306, the reticle carrier base is removed from the carrier assembly. In the depicted embodiment, the RLS manipulator lowers the reticle carrier base 156 away from reticle carrier 153. In some embodiments, the reticle carrier base 156 is moved into storage in the controlled environment of RLS 130. In this manner, the reticle carrier base 156 is stored for further use in a clean, dry environment.

In block 307, an EIP base is moved under the reticle and placed in contact with the reticle. In the depicted embodiment, EIP base 16 is retrieved from storage by the RLS manipulator and located beneath reticle 150. The RLS manipulator moves the EIP base 16 upward to make contact with reticle 150.

In block 308, the reticle is unclamped and separated from the reticle carrier. In the depicted embodiment, the reticle clamping elements 155 of reticle carrier 153 are retracted by actuators 154. The RLS manipulator then lowers the EIP base 16 with the reticle 150 attached.

In block 309, the reticle carrier is stored in the reticle inspection system for later use. In one embodiment, the RLS manipulator moves the reticle carrier 153 into storage in the controlled environment of RLS 130. In this manner, the reticle carrier 153 is stored for further use in a clean, dry environment.

In block 310, an EIP cover is moved over the reticle and the EIP cover is coupled to the EIP base. In one embodiment, the RLS manipulator retrieves EIP cover 15 from storage and locates the EIP cover on station 136. The EIP base 14 with reticle 150 is then lifted into contact with EIP cover 15. The EIP cover 15 is then placed on EIP base 16.

In block 311, the EIP is moved into an EUV reticle pod (e.g., RSP). In the depicted embodiment, one or more manipulators of pod loading system 140 locate the RSP cover 12 above EIP 14 and the RSP base 13 below the EIP 14. The RSP cover 12 and RSP base 13 are coupled together to fixedly position EIP 14 within EUV reticle pod 10. In some embodiments, the RSP cover 12 and RSP base 13 are retrieved from storage in the pod loading system 140.

In block 312, the EUV reticle pod is moved to a location for removal from the reticle inspection system. In the depicted embodiment, EUV reticle pod 10 is moved to an unload position by pod loading system 140. From this position, EUV reticle pod 10 may be removed from the reticle inspection system 100. In some embodiments, EUV reticle pod 10 is manually carried away from pod loading system 140. In some other embodiments, an automated transport system installed in a semiconductor fabrication facility carries the EUV reticle pod 10 away from the pod loading system 140.

In the aforementioned description, the EIP is replaced by a carrier assembly before entry into the clean vacuum environment of reticle inspection system 100. However, in some other embodiments, the EIP is augmented before entry into the clean vacuum environment. In one example, the EIP 14 is opened and a reticle carrier is inserted between the EIP cover 15 and EIP base 16. The reticle carrier includes features to clamp reticle 150 to the reticle carrier and includes features that allow the carrier to be mounted on reticle stage 102 in any of four orientations separated by ninety degrees. In this sense, the reticle carrier is reticle carrier 153 configured to fit between EIP cover 15 and EIP base 16. In these embodiments, the augmented EIP includes a stack of elements that includes the EIP cover 15, the reticle carrier clamped to reticle 150, and EIP base 16. This augmented EIP is then moved through the load lock 120 and opened inside transfer chamber 110.

In some embodiments, the augmented EIP also includes an EIP base adapter plate located below the EIP base 16. As discussed hereinbefore, reticle carrier base plate 156 includes features that allowed the carrier assembly to be coupled to the end effector 131 of the RLS manipulator in any of four different orientations separated by ninety degrees. These features are included to allow the reticle 150 to be reoriented while inside carrier assembly 153. A standard EIP base 16 does not include these features. Thus, the standard EIP base can only be coupled to end effector 131 in one orientation. To address this lack of flexibility EIP base adapter plate is included between end effector 131 and EIP base 16. The bottom side of EIP base adapter plate includes features that allow it to be addressed by end effector 131 in any of four different orientations separated by ninety degrees. In one example, these features are the same features described with reference to reticle carrier base 156. The top side of the EIP base adapter plate includes features that mate with the existing features on the bottom of EIP base 16. In this manner, the augmented EIP stack can be addressed in any of four different orientations separated by ninety degrees.

The aforementioned embodiments of a EUV reticle inspection system are presented by way of non-limiting example. Other configurations may also be contemplated within the scope of this disclosure.

As illustrated in FIG. 1, the reticle inspection system 100 is configured as an inspection system. In particular, the system is configured as an EUV reticle inspection system. In this manner, the system may be configured to inspect a reticle to be used as part of an EUV lithography process. However, the methods and systems described herein are not limited to the inspection of EUV reticles and may be applied to the inspection of other specimens, such as semiconductor wafers.

The reticle handling methods and apparatus described herein may be applied to a reticle inspection system that includes any reticle inspection technology suitable to perform the actual inspection operations. Exemplary technologies include optical inspection by EUV, VUV, and DUV radiation. Other exemplary technologies include electron-based inspection technologies. Examples of electron based inspection systems are illustrated in U.S. Pat. No. 6,555,830 to Mankos et al., U.S. Pat. No. 6,759,654 to Mankos et al., and U.S. Pat. No. 6,878,937 to Mankos, which are incorporated by reference as if fully set forth herein.

Various embodiments are described herein for a semiconductor processing system (e.g., an inspection system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as quartz. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method of handling a reticle in a reticle inspection system comprising:

opening an EUV Inner Pod (EIP) in a clean, dry air environment with flow control by separating an EIP base from an EIP cover of the EIP;

locating a reticle carrier over the reticle, wherein the reticle carrier is stored in the reticle inspection system;

clamping the reticle to the reticle carrier, wherein the clamping involves a movement of a plurality of reticle clamping elements relative to the reticle carrier from a disengaged position to an engaged position that grasps the reticle and clamps the reticle to the reticle carrier;

pumping down a chamber that includes the reticle carrier and the reticle; and locating the reticle carrier onto a reticle stage leaving a patterned surface of the reticle exposed for inspection, wherein the reticle carrier is attached to the reticle stage by a kinematic mount in any of four different orientations separated by ninety degrees.

2. The method of claim 1, further comprising:

locating a reticle carrier base under the reticle, the reticle carrier base including features to transport the reticle in any of four different orientations separated by ninety degrees, wherein the reticle carrier base is stored in the reticle inspection system.

3. The method of claim 2, further comprising:

coupling the reticle carrier base to the reticle carrier in atmosphere, wherein the reticle face does not touch the reticle carrier base; and decoupling the carrier base from the carrier in vacuum.

4. The method of claim 1, further comprising:

measuring an orientation of the reticle with respect to the reticle carrier; and reorienting the reticle with respect to the reticle carrier based at least in part on the measured orientation.

5. The method of claim 1, further comprising:

locating the EIP base under the reticle;

coupling the EIP base to the reticle carrier in atmosphere, wherein the EIP base does not contact a face of the reticle; and decoupling the EIP base from the reticle carrier in vacuum.

6. The method of claim 5, further comprising:

locating an EIP base adapter plate under the EIP base, wherein the EIP base adapter plate includes a plurality of features that enable the reticle to be transported in any of four different orientations separated by 90 degrees.

7. The method of claim 1, further comprising:

clamping the reticle carrier to the reticle stage.

8. The method of claim 1, further comprising:

performing a particle inspection of a backside of the reticle after separating the EIP base from the EIP cover.

9. A reticle inspection system comprising:

an EUV inner pod disposed in the reticle inspection system, the EUV inner pod storing a reticle;

a reticle carrier stored in a clean, dry environment in the reticle inspection system, the reticle carrier comprising:

a plurality of reticle clamping elements;

a plurality of actuators configured to move the plurality of reticle clamping elements relative to the reticle carrier from a disengaged position to an engaged position that grasps the reticle and clamps the reticle to the reticle carrier outside of a clean vacuum environment of the reticle inspection system when the reticle carrier is located over the reticle; and a set of kinematic mounting elements configured to kinematically couple the reticle carrier to a reticle stage of the reticle inspection system in any of four different orientations separated by ninety degrees in a clean vacuum environment, leaving a patterned surface of the reticle directly exposed for inspection.

10. The reticle inspection system of claim 9, further comprising:

a reticle carrier base stored in the reticle inspection system, wherein the reticle carrier base is configured to couple to the reticle carrier beneath and spaced apart from the reticle clamped to the reticle carrier.

11. The reticle inspection system of claim 10, wherein the reticle carrier base includes a set of features to transport the reticle in any of four different orientations separated by ninety degrees.

12. The reticle inspection system of claim 9, further comprising:

a particle inspection system configured to inspect a backside of the reticle for backside particle contamination.

13. The reticle inspection system of claim 9, further comprising:

a transfer chamber including a transfer chamber storage pod configured to reorient a reticle carrier in any of four different orientations separated by ninety degrees.

14. A method of handling a reticle in a reticle inspection system comprising:

coupling a reticle carrier base to a reticle carrier that is kinematically mounted to a reticle stage in a clean vacuum environment of the reticle inspection system, wherein the reticle carrier base covers and is spaced apart from a patterned surface of the reticle that is clamped to the reticle carrier, and wherein the reticle carrier includes a set of features configured to kinematically couple to the reticle stage in any of four different orientations separated by ninety degrees;

moving the reticle carrier and the reticle carrier base from the clean vacuum environment to a clean, dry air environment of the reticle inspection system;

decoupling the reticle carrier base from the reticle carrier in the clean, dry air environment; and unclamping the reticle from the reticle carrier in the clean, dry air environment, wherein the unclamping involves a movement of a plurality of reticle clamping elements relative to the reticle carrier from an engaged position to a disengaged position that unclamps the reticle from the reticle carrier.

15. The method of handling a reticle in a reticle inspection system of claim 14, wherein the reticle carrier and the reticle carrier base are stored in the clean, dry air environment of the reticle inspection system.

16. The method of handling a reticle in a reticle inspection system of claim 14, further comprising:

locating an EUV Inner Pod (EIP) base under the reticle; and coupling the EIP base to the reticle.

17. The method of handling a reticle in a reticle inspection system of claim 16, further comprising:

locating an EIP cover over the reticle and EIP base; and coupling the EIP base to the EIP cover.

* * * * *